United States Patent
Teng et al.

(10) Patent No.: US 6,720,664 B1
(45) Date of Patent: Apr. 13, 2004

(54) SUBMOUNT-HOLDER FOR FLIP CHIP PACKAGE

(75) Inventors: Chi-Jen Teng, Hsinchu (TW); Wan-Fang Shih, Hsinchu (TW); Zhi-Ping He, Taipei (TW); Cheng-Wei Ko, Feng-Yuan (TW)

(73) Assignee: Tyntek Corporation, Hsinchu (TW)

( * ) Notice: Subject to any disclaimer, the term of this patent is extended or adjusted under 35 U.S.C. 154(b) by 0 days.

(21) Appl. No.: 10/419,829

(22) Filed: Apr. 22, 2003

(51) Int. Cl.[7] .......................... H01L 23/48; H01L 29/40
(52) U.S. Cl. .................... 257/778; 257/618; 257/622; 257/623
(58) Field of Search ................................ 257/778, 618, 257/622, 623

(56) References Cited

U.S. PATENT DOCUMENTS

| | | | |
|---|---|---|---|
| 4,670,770 A | * 6/1987 | Tai | 257/777 |
| 6,040,618 A | * 3/2000 | Akram | 257/586 |

* cited by examiner

Primary Examiner—Phat X. Cao
Assistant Examiner—Theresa T. Doan
(74) Attorney, Agent, or Firm—Troxell Law Office PLLC

(57) ABSTRACT

A submount holder for flip chip packaging of light emitting diode (LED) includes a substrate on which a body is formed. The submount body defines a cavity sized and shaped to snugly receive an LED die therein. The cavity precisely retains the die in position and prevents the die from arbitrary movement during a packaging and wiring process. First and second connection sections are formed on opposite sides of the cavity and respectively connected to the cavity by a channel. A conductively layer is formed on the substrate in the cavity, the first and second connection sections and the channels connecting the connection sections and the cavity. A groove is defined in the body and extends through the cavity with the connection sections located on opposite sides of the groove. The conductive layer is divided by the groove into separated and isolated portions. The die is received in the cavity with positive and negative terminals thereof respectively engaging the conductive layers of the first and second connection sections. The first and second connection sections allow for ready connection of wires thereto for a wiring process of the package.

6 Claims, 8 Drawing Sheets

SUBMOUNT-HOLDER FOR FLIP CHIP PACKAGE

FIELD OF THE INVENTION

The present invention generally relates to the field of flip chip packaging, and in particular to a submount holder for precisely retaining a die of light emitting diode (LED) in position during packaging and wiring process of the LED die.

BACKGROUND OF THE INVENTION

A die of light emitting diodes (LEDs) generally comprises a transparent substrate on which a N-type semiconductor layer forming a first electrode terminal, a light generating layer and a P-type semiconductor layer forming a second electrode terminal are sequentially formed and stacked. Thereafter, wires are respectively mounted to the N-type and P-type semiconductor layers and the device is then package. An LED die is thus completed. When the LED die is energized via the wires, the LED gives off light.

Since the die has a very small size, the electrodes formed on the P-type and N-type semiconductor layers are tiny and wiring becomes very difficult. Mass production of the LED die is thus subject to the limitation of the wiring problems.

SUMMARY OF THE INVENTION

An object of the present invention is to provide a submount holder for precisely positioning an LED die in flip chip packaging process and preventing the die from undesired movement during the packaging and wiring process.

Another object of the present invention is to provide a submount holder for correctly positioning an LED die in a flip chip packaging process for fool-proof purposes.

A further object of the present invention is to provide a submount holder for enhancing chip bonding with holder and thus improving the mass production of flip chip packaging.

To achieve the above objects, in accordance with the present invention, there is provided a submount holder for flip chip packaging of light emitting diode (LED) comprising a substrate on which a body is formed. The body defines a cavity sized and shaped to snugly receive an LED die therein. The cavity precisely retains the die in position and prevents the die from arbitrary movement during a packaging and wiring process. First and second connection sections are formed on opposite sides of the cavity and respectively connected to the cavity by a channel. A conductively layer is formed on the substrate in the cavity, the first and second connection sections and the channels connecting the connection sections and the cavity. A groove is defined in the body and extends through the cavity with the connection sections located on opposite sides of the groove. The conductive layer is divided by the groove into separated and isolated portions. The die is received in the cavity with positive and negative terminals thereof respectively engaging the conductive layers of the first and second connection sections. The first and second connection sections allow for ready connection of wires thereto for a wiring process of the package.

BRIEF DESCRIPTION OF THE DRAWINGS

The present invention will be apparent to those skilled in the art by reading the following description of the preferred embodiments thereof, with reference to the attached drawings, in which.

DETAILED DESCRIPTION OF THE PREFERRED EMBODIMENTS

Figure 1:
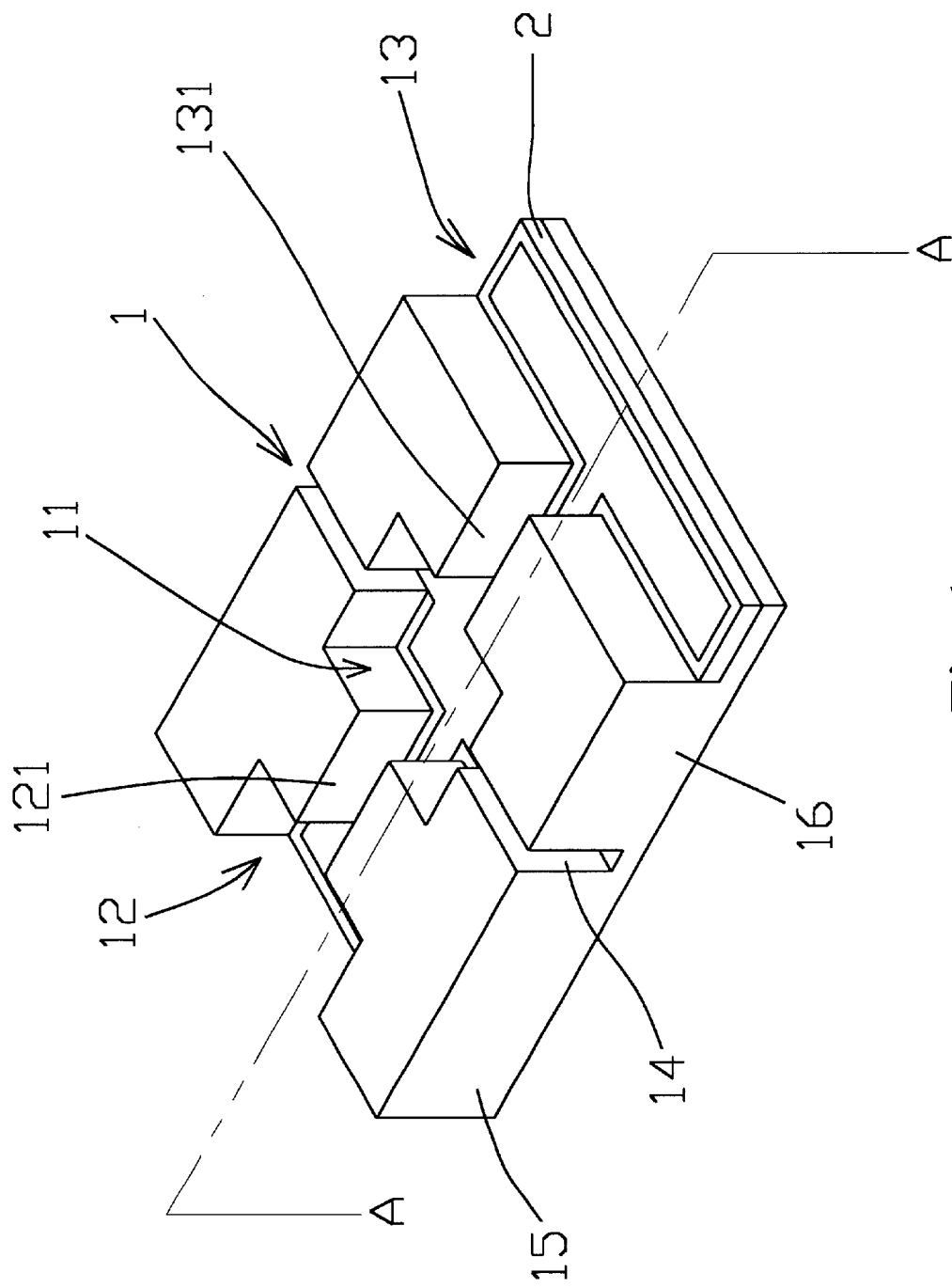
FIG. 1 is a perspective view of a die holder constructed in accordance with the present invention.
Figure 2:
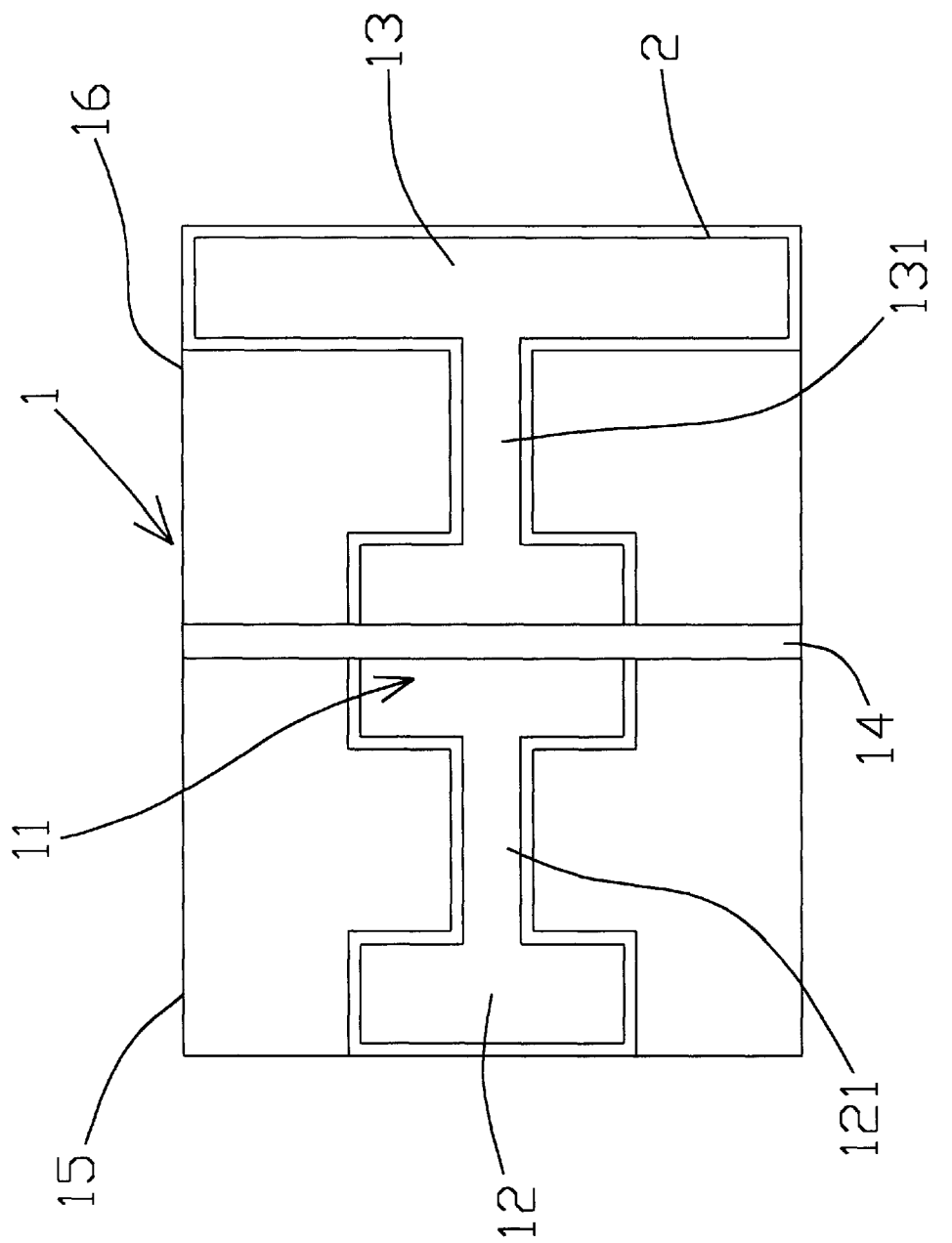
FIG. 2 is a top plan view of the die holder of the present invention.
Figure 3:
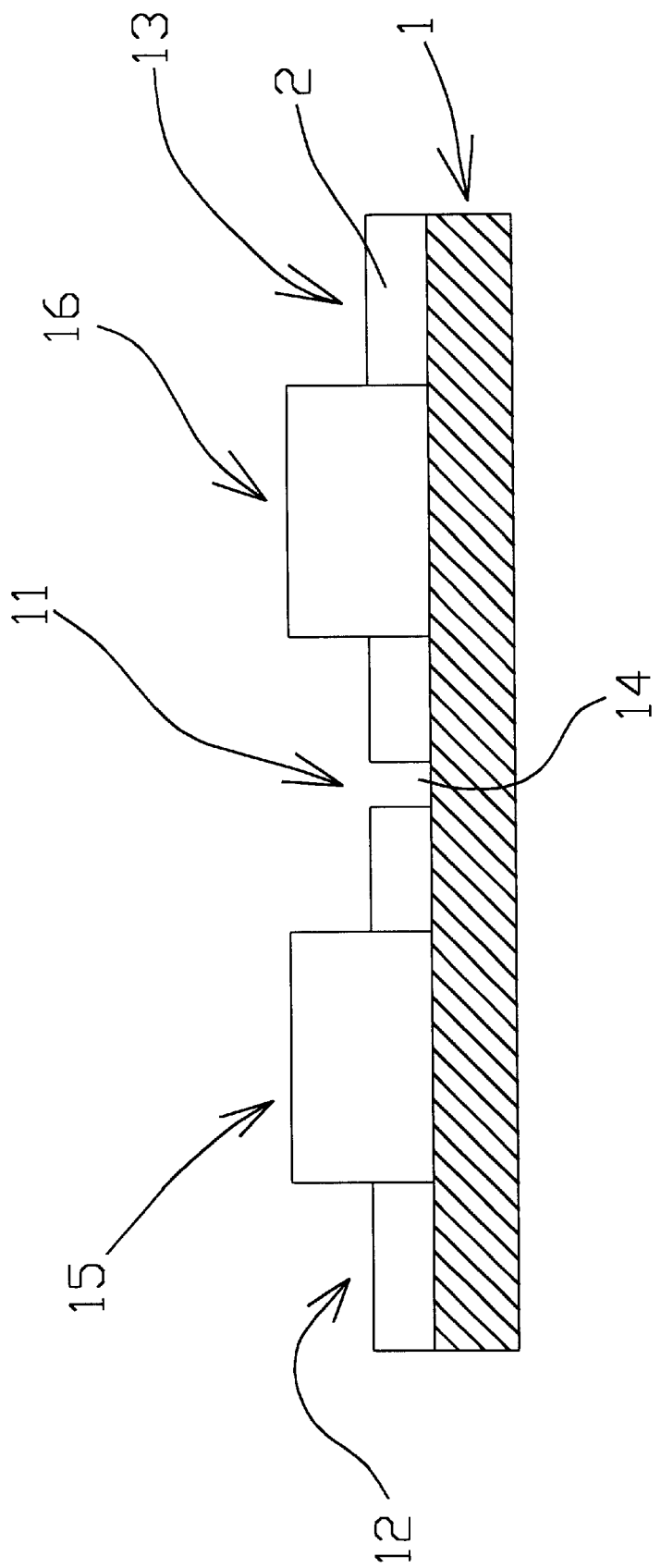
FIG. 3 is a cross-sectional view taken along line A—A of FIG. 1.

With reference to the drawings and in particular to FIGS. 1–3, a die submount holder constructed in accordance with the present invention, generally designated with reference numeral 1, comprises a block-like body (not labeled) in which a cavity 11 is defined. The cavity 11 has a size and shape corresponding to a die 3 (FIGS. 4 and 5) to be deposited therein whereby the die 3 can be snugly received and retained in the cavity 11. First and second connection sections 12, 13, each defining a recess, are formed on opposite sides of the cavity 11. The recesses of the first and second connection sections 12, 13 are of different sizes or areas. In the embodiment, the recess of the first connection section 12 has a size or area smaller than that of the recess of the second connection section 13. This provides ready distinction therebetween. A first channel 121 and a second channel 131 are formed in the block of the submount holder 1 and respectively communicating between the cavity 11 and the recesses of the first and second connection sections 12, 13. A conductive layer 2 is formed on the bottom of the cavity 11 and the first and second connection sections 12, 13 as well as the channels 121, 131

A groove 14 is defined in the body of the holder 1 and extends through the cavity 11 with the first and second connection sections 12, 13 located on opposite sides of the groove 14. The groove 14 divides the holder 1 into a first electrode portion 15 and a second electrode portion 16 which are isolated from each other by the groove 14. The conductive layer 2 is thus divided into two separate and isolated portions respectively associated with the first and second connection sections 12, 13.

The cavity 11 has a shape corresponding to that of the die 3 whereby the die 3 can be precisely received and retained in the cavity 11 and fool-proofness can thus be achieved. The cavity 11 also helps preventing the die 3 from arbitrarily moving with respect to the holder 1 during the packaging and wiring process. The connection sections 12, 13 allow for efficient and ready wiring of the die 3.

Figure 4:
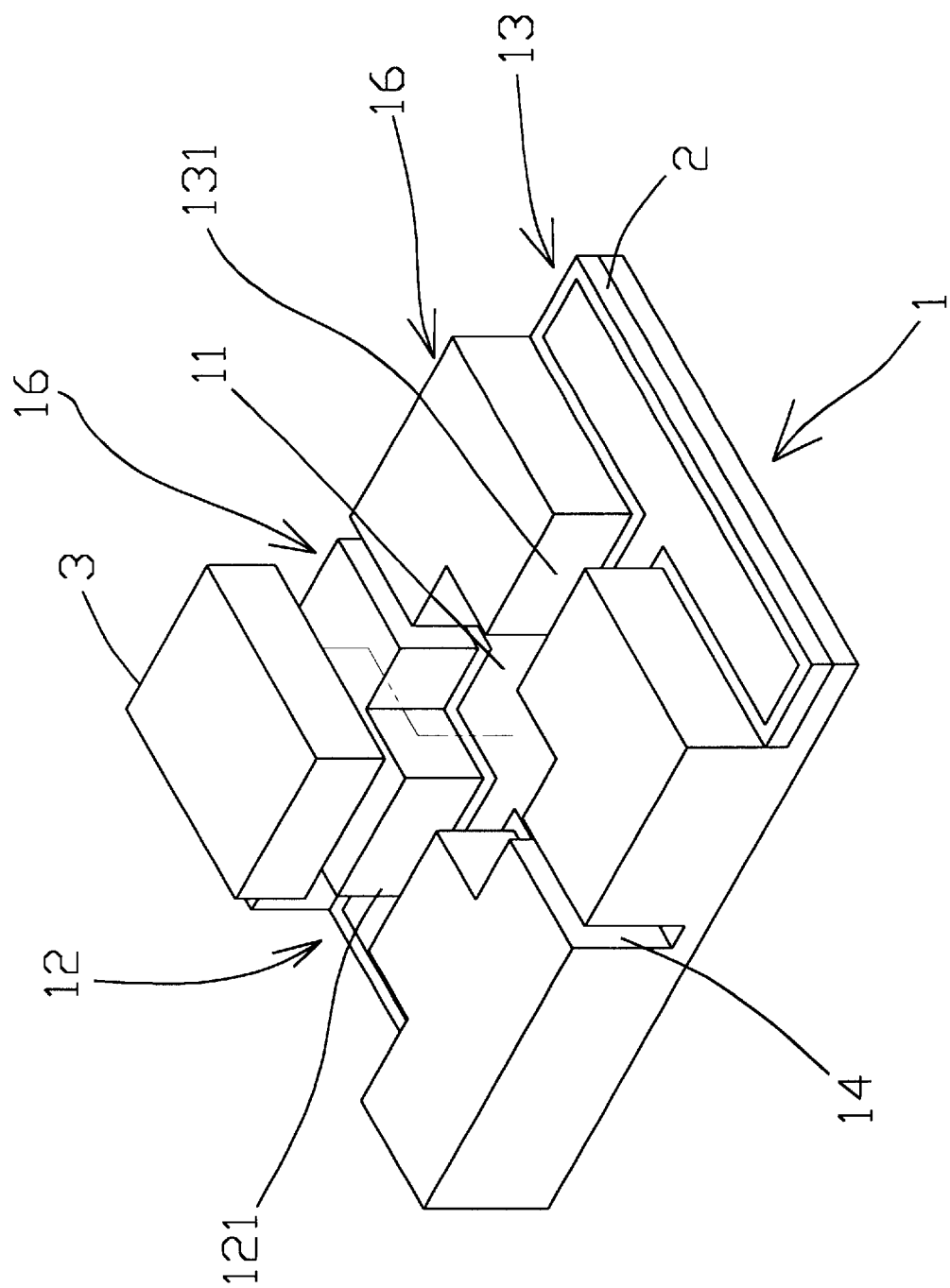
FIG. 4 is a perspective view showing depositing a die into the die holder of the present invention.
Figure 5:
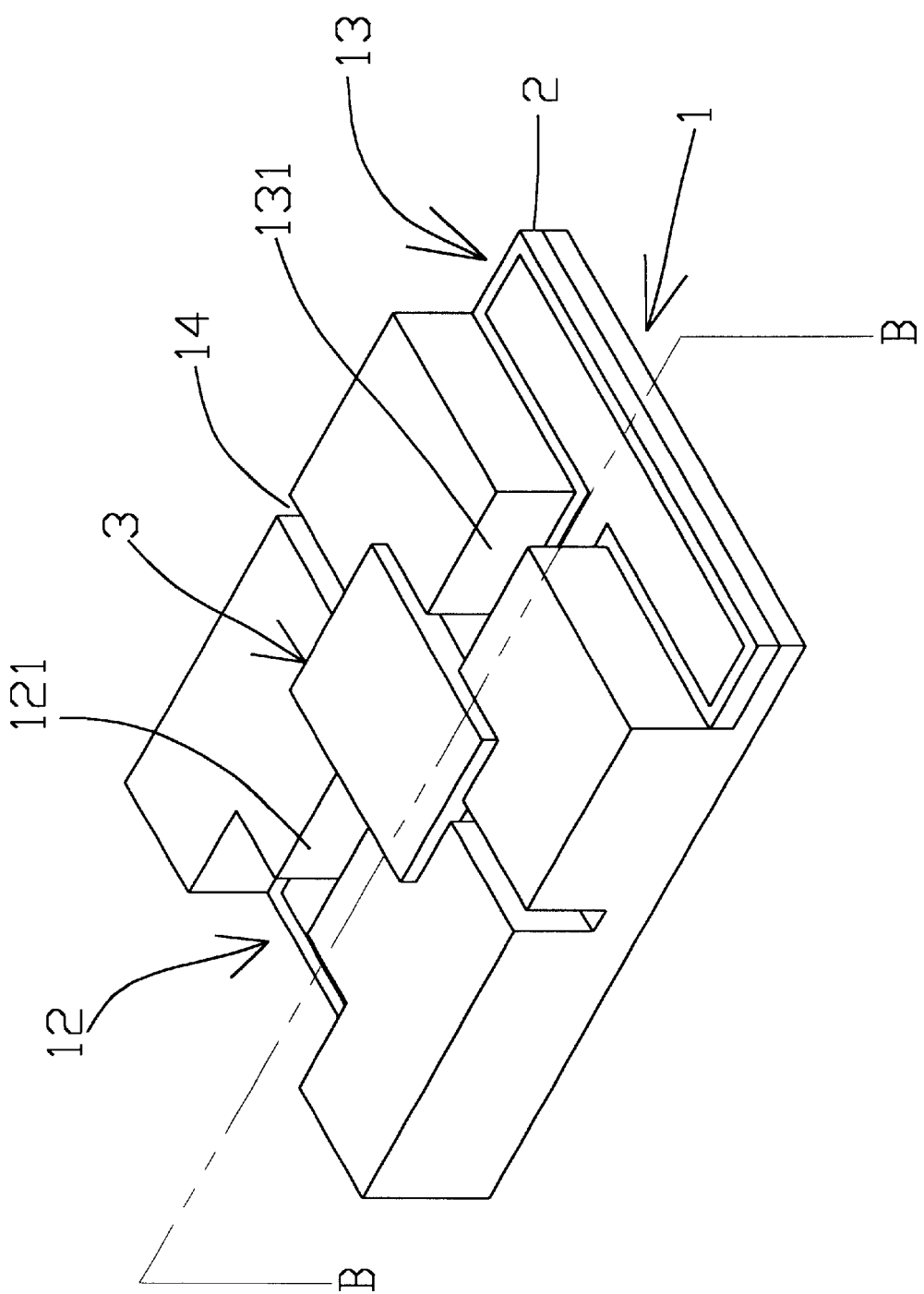
FIG. 5 is a perspective view showing the die completely received in the die holder of the present invention.
Figure 6:
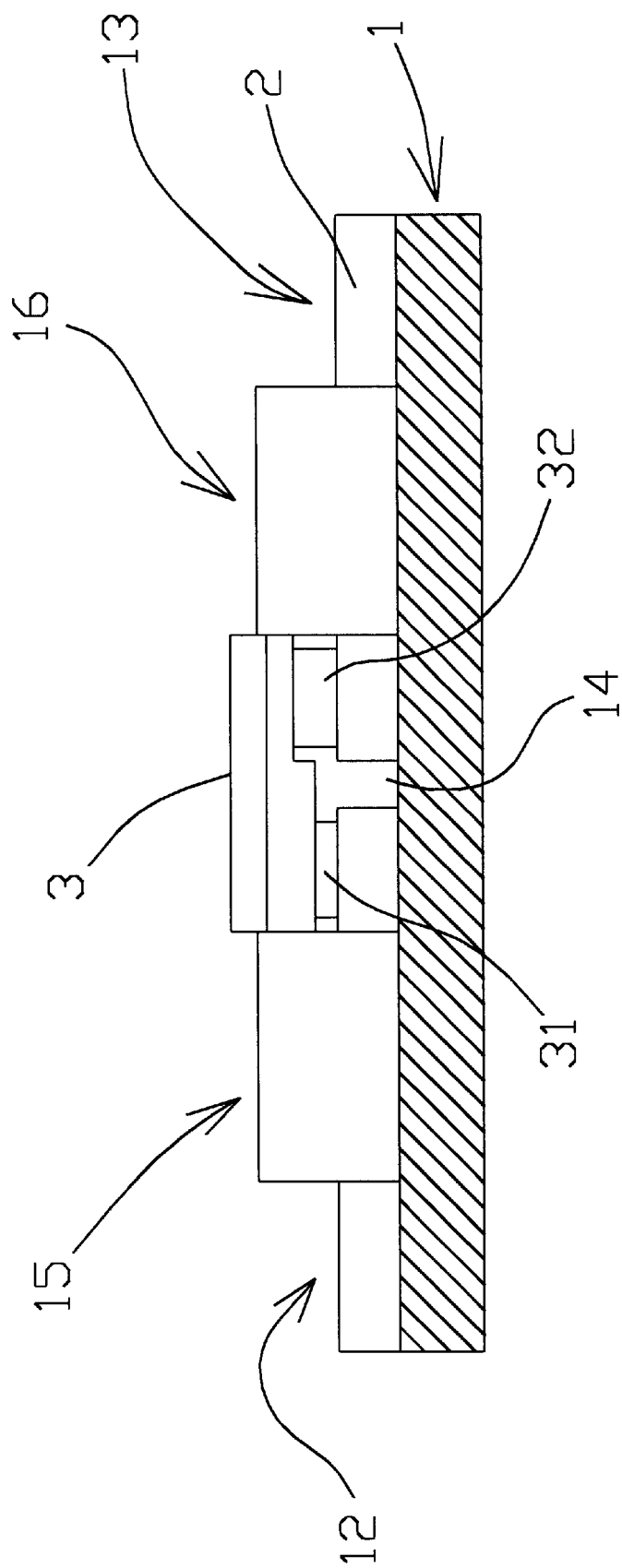
FIG. 6 is a cross-sectional view taken along line B—B of FIG. 5.

Also referring to FIGS. 4, 5 and 6, the die 3 is deposited in the cavity 11 of the holder 1 in an up-side-down manner. Positive terminal 31 and negative terminal 32 of the die 3 respectively engage the conductive layer 2 of first and second connection sections 12, 13. The positive and negative terminals 31, 32 of the die 3 are isolated by the groove 14 of the holder 1. The size difference between the connection sections 12, 13 allows for ready distinction between the positive electrode and negative electrode of the die 3. The die 3 may then be bonded to the conductive layer 2 in any known means, such as heat-melting. After wiring connected to the connection sections 12, 13 is completed, the die 3 can be packaged.

Figure 7:
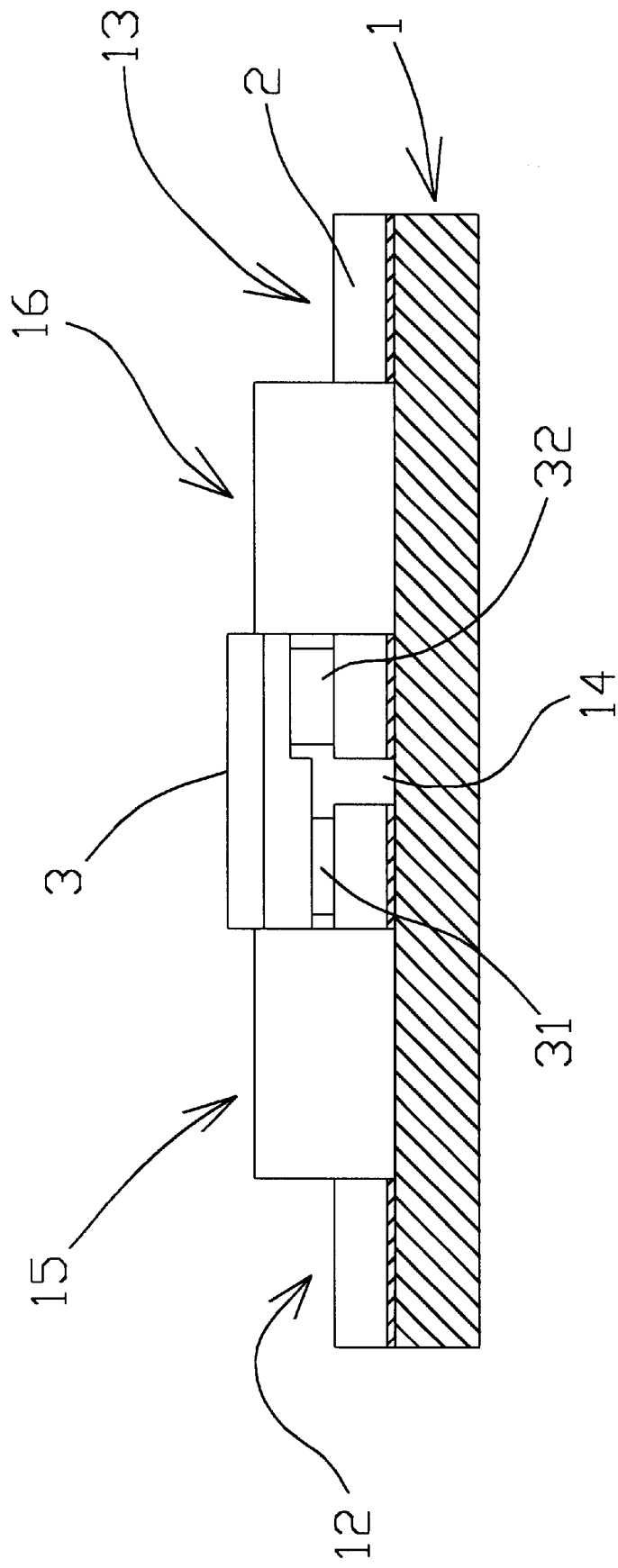
FIG. 7 is a cross-sectional view similar to FIG. 6 but showing a die holder constructed in accordance with another embodiment of the present invention.

The submount holder 1 can be formed on a substrate, which may be made of insulative material or conductive material. If the substrate is made of a conductive material, an insulative layer 4 is required between the conductive layer 2 and the substrate in order to eliminate undesired shorting there between. This is shown in FIG. 7.

Figure 8:
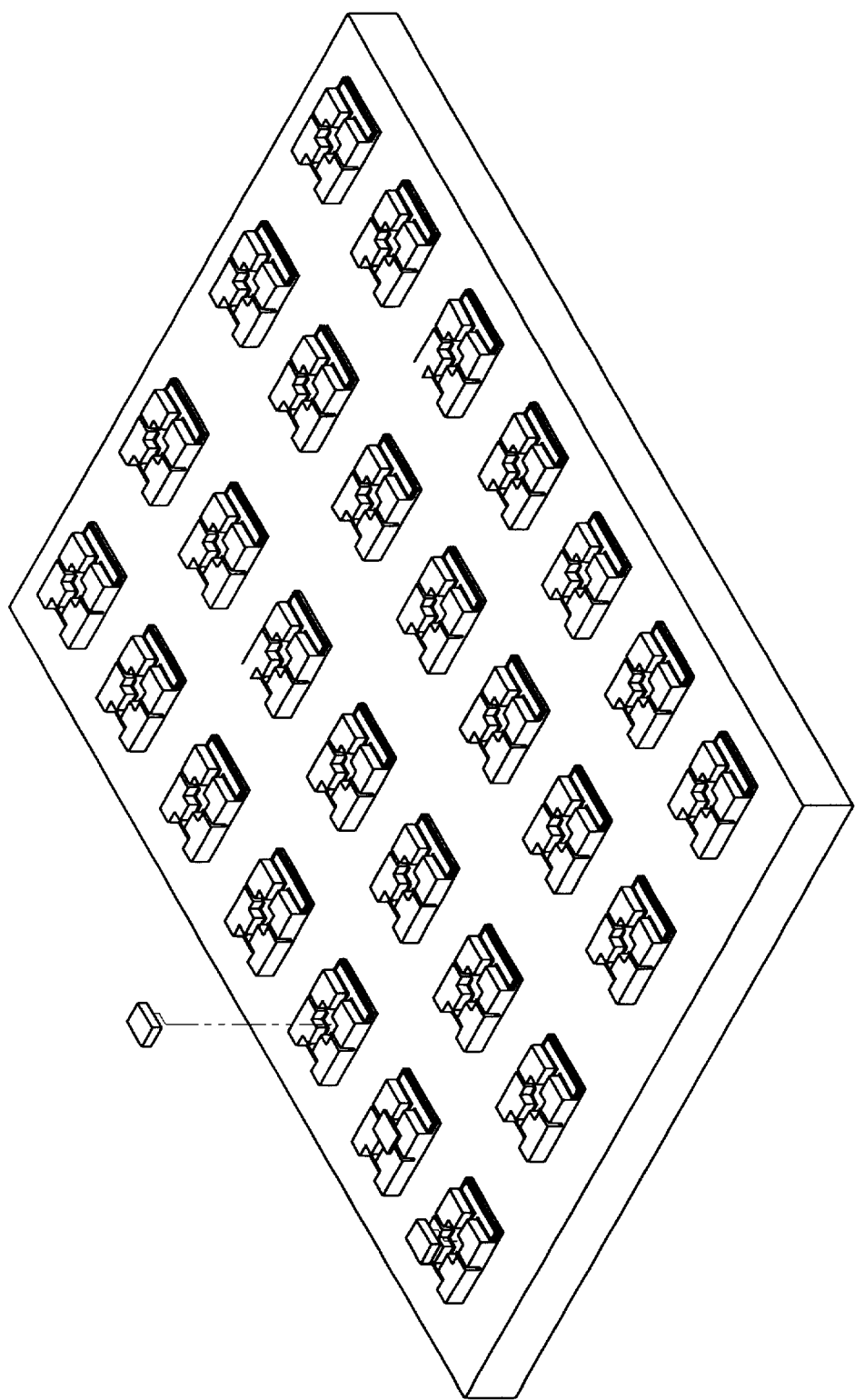
FIG. 8 is a perspective view showing a further embodiment in accordance with the present invention in which a number of die holders are formed on a substrate for receiving and retaining a number of dies.

FIG. 8 shows a further application of the die holder in accordance with the present invention, wherein a large area substrate 5 is provided on which a number of die holders 1 of the present invention are formed and arranged in an array. The holders 1 are spaced from each other. Each die holder 1 receives and retains a die 3. The die 3 is bonded to the holder 1 by any known means, such as heat-melting. The large area substrate 5 is then cut into a number of separate holders 1 that retain the dies 3. This enhances the mass production of the dies 3.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A submount holder for flip chip packaging comprising:

a body formed on a substrate, the body defining a cavity adapted to receive and retain a die therein, first and second connection sections formed on opposite sides of the cavity, first and second channels defined in the body and respectively communicating between the first and second connection sections and the cavity;

a conductive layer formed on the substrate in the cavity, the first and second channels and the first and second connection sections; and a groove defined in the body and extending through the cavity with the first and second connection sections located on opposite sides of the groove, the groove dividing the conductive layer into first and second portions respectively associated with the first and second connection sections, the first and second portions of the conductive layer being isolated from each other by the groove, wherein when the die is received in the cavity, positive and negative terminals of the die respectively engage the first and second portions of the conductive layer to form electrical engagement therebetween.

2. The submount holder as claimed in claim 1, wherein the substrate is made of a conductive material.

3. The submount holder as claimed in claim 2 further comprising an insulative layer formed between the conductive substrate and the conductive layer.

4. The submount holder as claimed in claim 1, wherein the substrate is made of an insulative material.

5. The submount holder as claimed in claim 1, wherein the first and second connection sections have different sizes.

6. The submount holder as claimed in claim 1, wherein a number of holder bodies are formed on the substrate and spaced from each other, each holder body receiving and retaining a die.

* * * * *